(12) United States Patent
Singh et al.

(10) Patent No.: US 11,935,895 B2
(45) Date of Patent: Mar. 19, 2024

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Gulbagh Singh, Tainan (TW); Tsung-Han Tsai, Miaoli (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 6 days.

(21) Appl. No.: 17/584,306

(22) Filed: Jan. 25, 2022

(65) Prior Publication Data

US 2023/0010934 A1    Jan. 12, 2023

Related U.S. Application Data

(60) Provisional application No. 63/219,438, filed on Jul. 8, 2021.

(51) Int. Cl.
| | |
|---|---|
| *H01L 27/12* | (2006.01) |
| *H01L 21/762* | (2006.01) |
| *H01L 21/84* | (2006.01) |
| *H01L 23/48* | (2006.01) |

(52) U.S. Cl.
CPC .... *H01L 27/1207* (2013.01); *H01L 21/76224* (2013.01); *H01L 21/84* (2013.01); *H01L 23/481* (2013.01)

(58) Field of Classification Search
CPC ............... H01L 27/1207; H01L 21/84; H01L 21/76224; H01L 21/76283; H01L 21/481; H01L 21/76898; H01L 29/0649; H01L 27/1203

USPC .......................................... 438/149; 257/347
See application file for complete search history.

(56) References Cited

U.S. PATENT DOCUMENTS

| | | | |
|---|---|---|---|
| 9,293,582 B2 | 3/2016 | Currie | |
| 2015/0348870 A1* | 12/2015 | Feichenfeld et al. | ........................ H01L 23/481 |

\* cited by examiner

*Primary Examiner* — Thinh T Nguyen
(74) *Attorney, Agent, or Firm* — NZ CARR LAW OFFICE

(57) ABSTRACT

A semiconductor device structure includes a first MOSFET device disposed at a first region of a semiconductor substrate, the first MOSFET device comprises a bulk semiconductor layer contacting the semiconductor substrate, and the bulk semiconductor layer has a first height, a first gate structure disposed over the bulk semiconductor layer, and first S/D regions disposed in the bulk semiconductor layer on opposite sides of the first gate structure; a second MOSFET device disposed at a second region of the semiconductor substrate, the second MOSFET device comprises a semiconductor layer disposed over the semiconductor substrate, and the semiconductor layer has a second height different than the first height, a second gate structure disposed over the semiconductor layer, and second S/D regions disposed in the semiconductor layer on opposite sides of the second gate structure; an insulator between and in contact with the semiconductor substrate and semiconductor layer; and a spacer layer isolating the first and second MOSFET devices, and a portion of the spacer layer is disposed between and in contact with the insulator layer and bulk semiconductor layer.

12 Claims, 12 Drawing Sheets

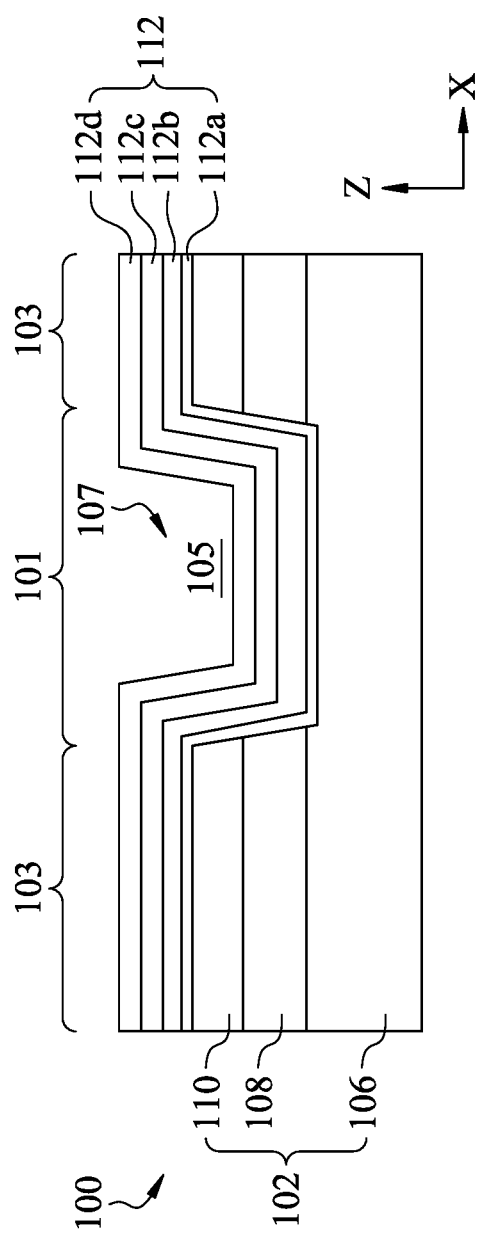
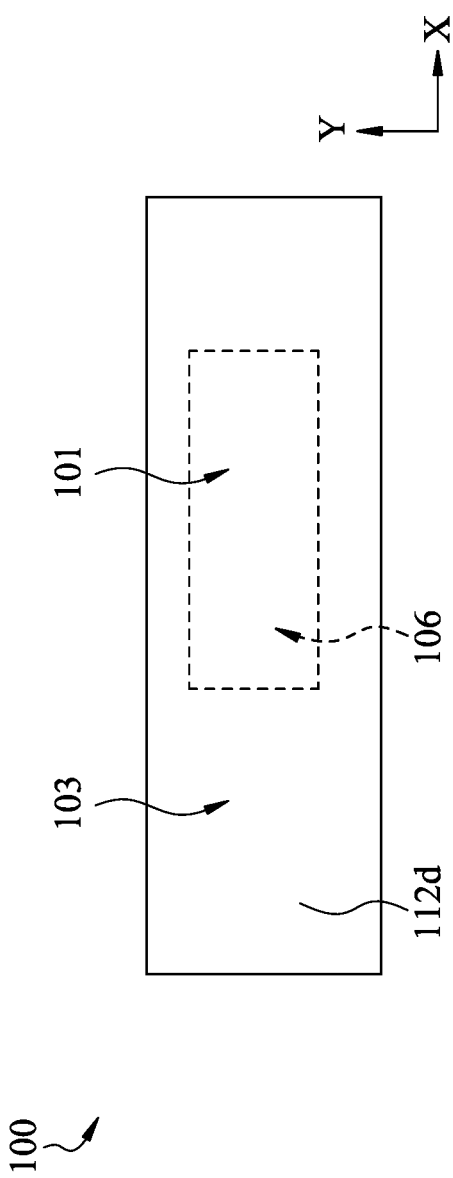
Fig. 3A
Fig. 3B

SEMICONDUCTOR DEVICE STRUCTURE AND METHODS OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In order to produce competitive electronic devices, it is often desired to produce semiconductor chips with several different regions (e.g., core region, low power region, I/O region) having semiconductor devices that vary according to speed and power, for example. The desire for higher performance circuits has driven the development of high-speed silicon-on-insulator (SOI) complementary metal-oxide-semiconductor (CMOS) technology. In SOI technology, metal-oxide semiconductor field-effect transistors (MOSFETs) are formed on a thin layer of silicon overlying a layer of insulating material. Devices formed on SOI offer many advantages over their bulk counterparts, including reduced junction capacitance and full dielectric isolation, etc. SOI technology therefore enables higher speed performance and reduced power consumption.

However, implementing a SOI technology requires extensive circuit design due to the different behavior of the SOI devices, which differs significantly from that of devices using bulk silicon substrate. Therefore, there is a continuous need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-8A are cross-sectional side views of various stages of manufacturing a semiconductor device structure according to embodiments of the present disclosure.

FIGS. 1B-8B are top views of various stages of manufacturing the semiconductor device structure according to embodiments of the present disclosure.

DETAILED DESCRIPTION

Figure 1A:
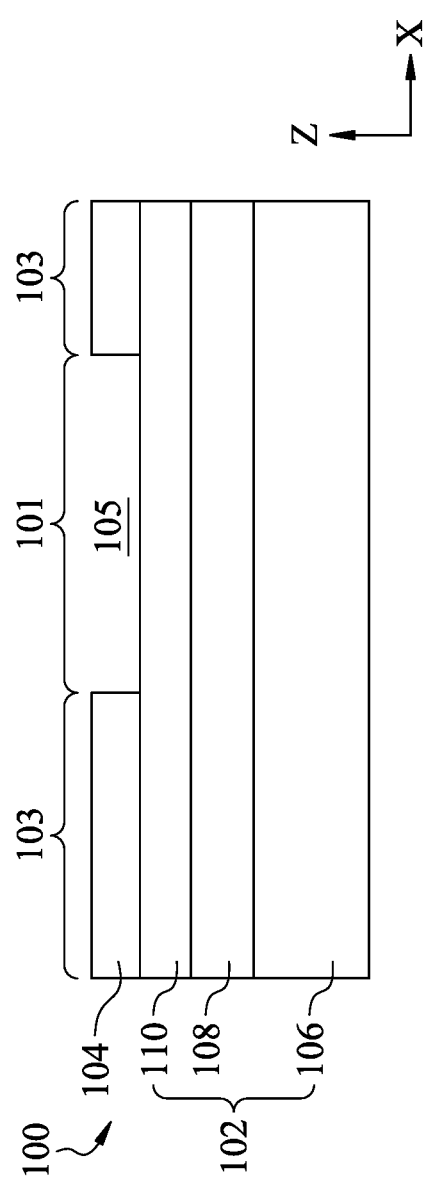

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 8A:
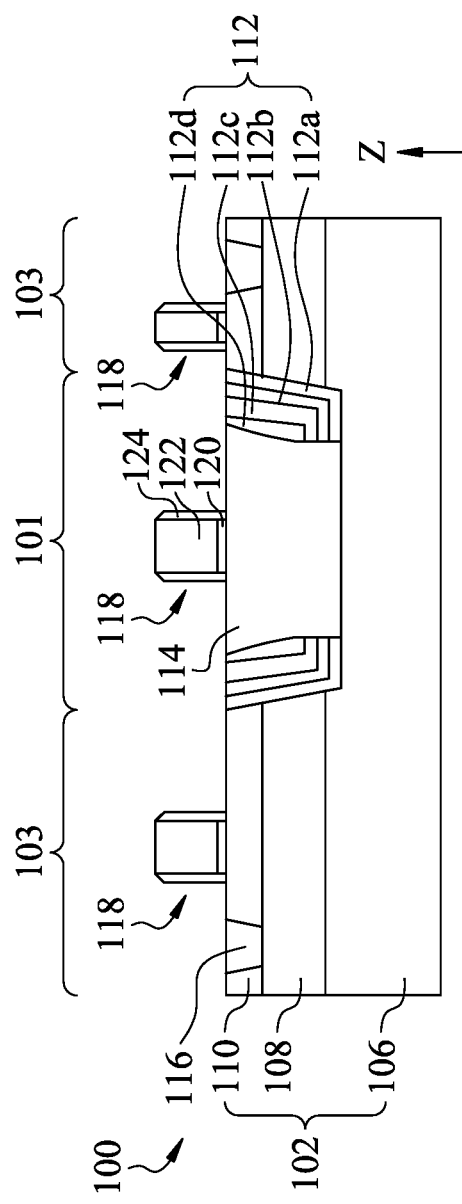
Figure 8B:
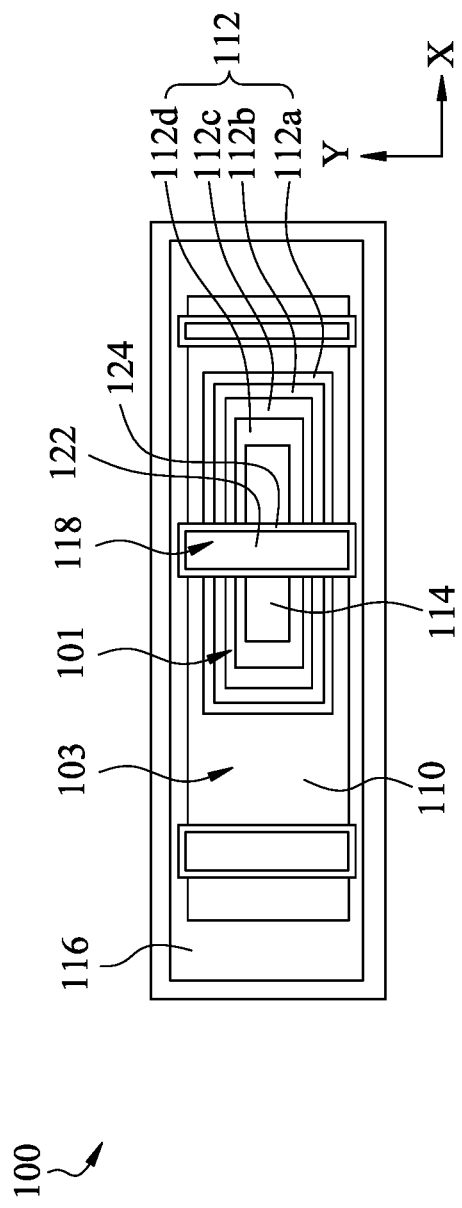
Figure 9:
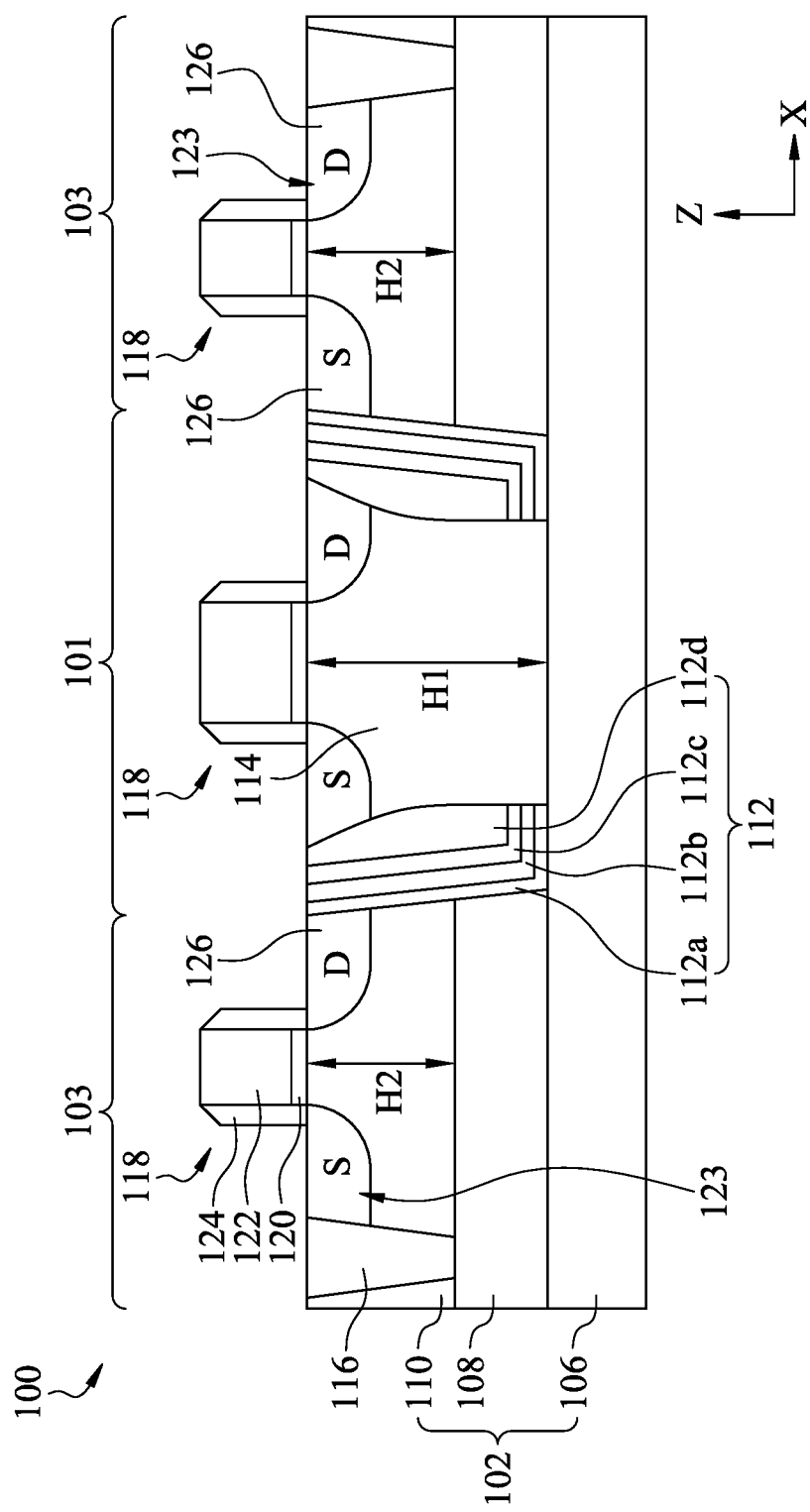
FIG. 9 is a cross-sectional side view of various stages of manufacturing a semiconductor device structure according to embodiments of the present disclosure.
Figure 10:
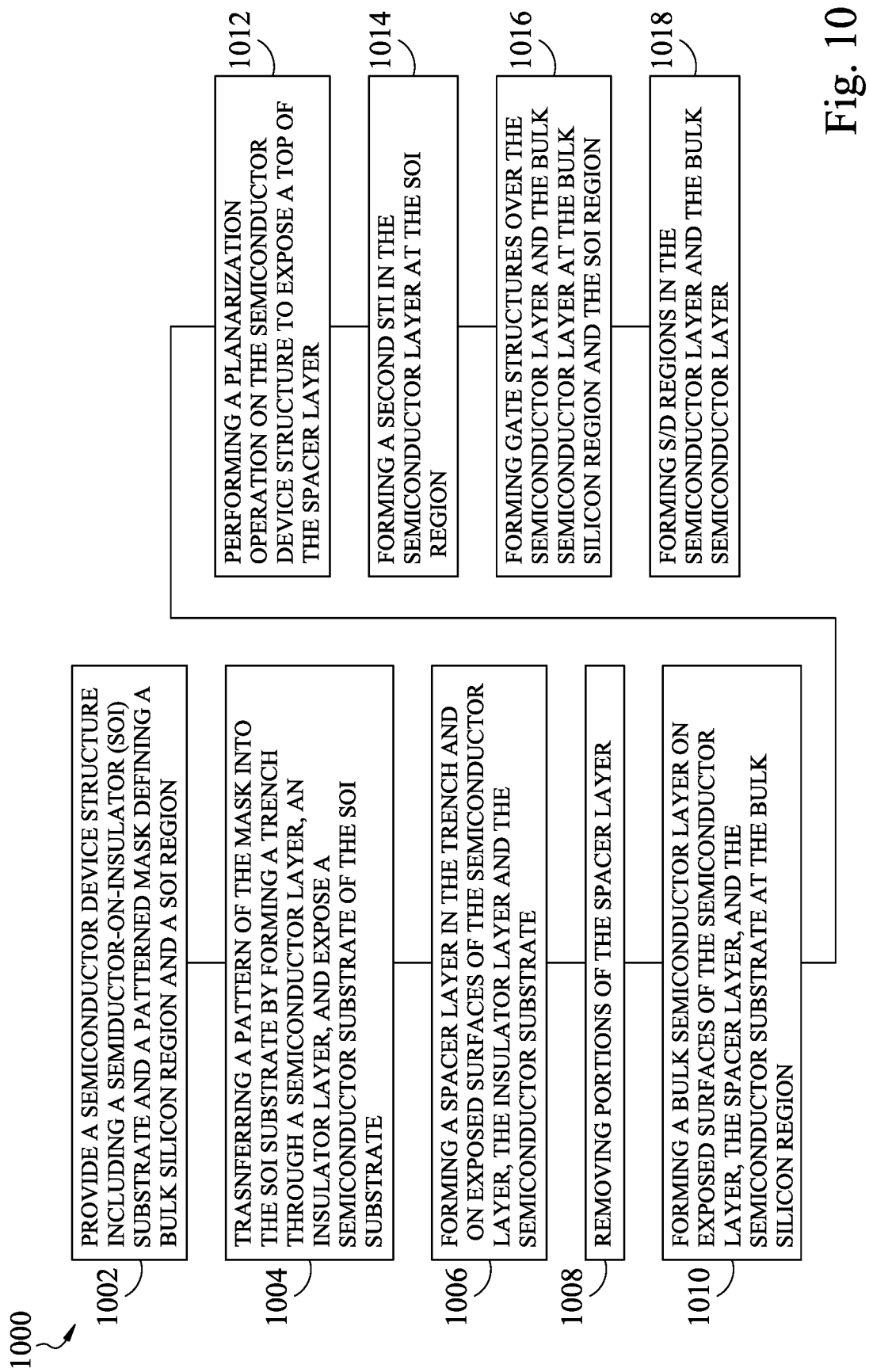
FIG. 10 is a flowchart of a method for manufacturing a semiconductor device structure according to embodiments of the present disclosure.

FIGS. 1A-8A and 9 are cross-sectional side views of various stages of manufacturing a semiconductor device structure 100 according to a flowchart of a method 1000 shown in FIG. 10. FIGS. 1B-8B are top views of various stages of manufacturing the semiconductor device structure 100 according to the method 1000 of FIG. 10. It is understood that additional operations can be provided before, during, and after processes shown by FIGS. 1A-1B to 8A-8B and 9, and some of the operations described below can be replaced or eliminated, or be executed in parallel for additional embodiments of the method.

Figure 1B:
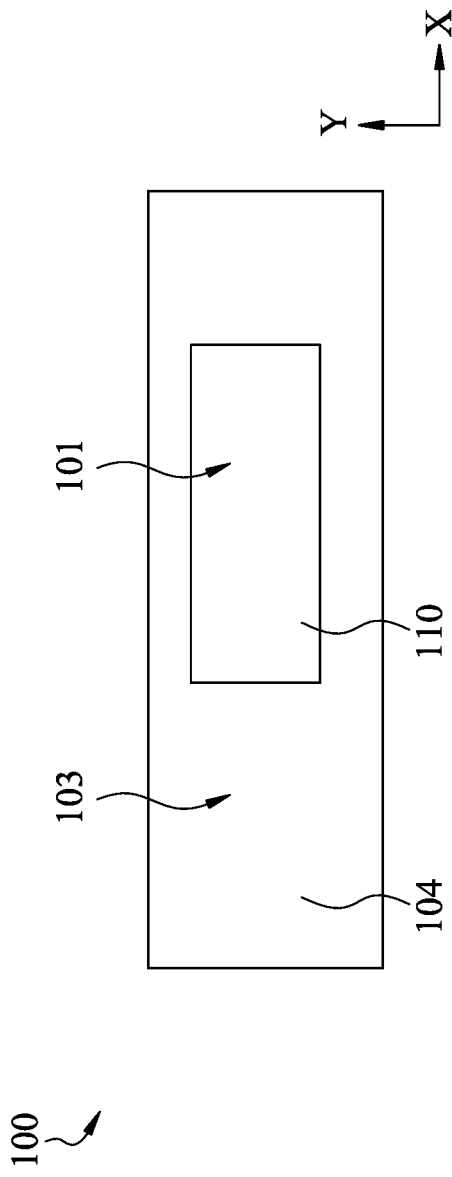

At operation 1002, a semiconductor device structure 100 including a silicon-on-insulator (SOI) structure 102 and a patterned mask layer 104 formed on the SOI structure 102 is provided, as shown in FIGS. 1A and 1B. The semiconductor device structure 100 may be a part of a substrate, wafer, or integrated chip. The SOI structure 102 generally includes a semiconductor substrate 106, an insulator layer 108 formed over the semiconductor substrate 106, and a semiconductor layer 110 formed over the insulator layer 108. The semiconductor substrate 106 may include or be formed of a crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb), and indium phosphide (InP). The insulator layer 108 may be a continuous buried insulating layer and may include or be formed of, for example, silicon dioxide ($SiO_2$), silicon nitride ($Si_3N_4$), aluminum oxide, magnesium oxide, and/or other suitable dielectric materials. In some embodiments, the insulator layer 108 is a multilayer structure including two or more different materials discussed herein. The insulator layer 108 may have a thickness in a range of about 20 nanometers (nm) to about 400 nm. The semiconductor layer 110 may include or be formed of a semiconductor material suitable for use as a channel of a metal-oxide-semiconductor field-effect transistor (MOSFET), such as at least one of a group IV material, e.g., silicon, SiGe, germanium, or an array of carbon nanotubes; a III-V material such as gallium arsenide, indium arsenide, indium gallium arsenide, indium phosphide, gallium nitride, indium antimonide, gallium antimonide, gallium phosphide; or a II-VI material, and mixtures or alloys including one or more of the aforementioned materials. The semiconductor layer 110 and the semiconductor substrate 106 may include n-type or p-type dopants, depending on the application. The semiconductor layer 110 may have a resistivity in a range of about 100 ohm/square to about 1000 ohm/square. The semiconductor layer 110 may have a dopant concentration $2\times10^{13}$ atoms/cm$^3$ to about $5\times10^{22}$ atoms/cm$^3$. In some embodiments, the semiconductor layer 110 and the semiconductor substrate 106 may include the same material. In some embodiments, the semiconductor layer 110 and the semiconductor substrate 106 may include different materials. The semiconductor layer 110 may have a thickness of about 10 nm to about 200 nm. Portions of the semiconductor layer 110 may serve as channel regions in the subsequently formed MOSFET device at a silicon-on-insulator (SOI) region 103. Thinner semiconductor layer 110 can provide better electrostatic channel control, leading to reduced source-to-drain leakage and reduced short channel effects.

The SOI structure 102 may be fabricated using a separation by implantation of oxygen (SIMOX) process where oxygen ions are implanted into a silicon substrate at a desired depth to form a buried oxide (BOX) thin film, followed by an anneal process in an inert environment with a small amount of oxygen to convert the oxygen-implanted region of the substrate to silica. Other suitable technique, such as a wafer bonding process, may also be used to form the SOI structure 102.

The mask layer 104 is formed over the semiconductor layer 110. The mask layer 104 may be any suitable masking material, such as a photoresist layer, a BARC (bottom anti-reflective coating) layer, a SOG (spin-on-glass) layer, or a SOC (spin-on-carbon) layer. In some embodiments, the mask layer 104 is a multi-layer resist, such as a tri-layer resist layer including a bottom layer, a middle layer formed over the bottom layer, and a photoresist layer formed over the middle layer. The bottom layer may be a bottom anti-reflective coating (BARC) layer and may include or be a carbon backbone polymer or a silicon-free material formed by a spin-on coating process, a CVD process, a FCVD process, or any suitable deposition technique. The middle layer may be a composition that provides anti-reflective properties and/or hard mask properties for a photolithography process. The middle layer provides etching selectivity from the bottom layer and the photoresist layer. The middle layer may include or be amorphous silicon, silicon carbide, silicon nitride, silicon oxynitride, silicon oxide, a silicon-containing inorganic polymer, or any combination thereof. The photoresist layer may include or be a DUV resist (KrF) resist, an argon fluoride (ArF) resist, an EUV resist, an electron beam (e-beam) resist, or an ion beam resist. Portions of the bottom layer, the middle layer, and the photoresist layer are removed by one or more photolithographic processes to form patterned mask layer 104. As a result of the one or more photolithographic processes, openings 105 are formed in the mask layer 104, and a portion of semiconductor layer 110 is exposed. For ease of illustration, only one opening 105 is shown in FIGS. 1A and 1B.

The exposed portion of the semiconductor layer 110 defines a bulk silicon region upon which a MOSFET device is to be formed. The portion of the semiconductor layer 110 covered by the patterned mask layer 104 defines one or more SOI regions. FIGS. 1A and 1B show one exemplary embodiment where the mask layer 104 is patterned to define a bulk silicon region 101. The bulk silicon region 101 is surrounded by a SOI region 103, which is defined by the portion of the semiconductor layer 110 covered by the patterned mask layer 104. While not shown in scale in some figures, it is contemplated that the bulk silicon region 101 and the SOI region 103 may be adjacent to each other as shown in FIGS. 1A and 1B, or may be located at different regions of the semiconductor device structure 100 along the X-axis or Y-axis. In any case, the bulk silicon region 101 and the SOI region 103 are formed in the same substrate, wafer, or integrated chip. As will be discussed in more detail below, a first MOSFET device may be fabricated on the bulk silicon region 101 of the semiconductor device structure 100 and a second MOSFET device may be fabricated on the SOI region 103 of the semiconductor device structure 100. In one embodiment, the first MOSFET device is an n-type MOSFET device and the second MOSFET device is a p-type MOSFET. In another embodiment, the first MOSFET device is an p-type MOSFET device and the second MOSFET device is a n-type MOSFET. In yet another embodiment, both the first and second MOSFET devices are n-type MOSFET devices or p-type MOSFET devices.

While embodiments described in this disclosure are described in the context of planar FETs, implementations of some aspects of the present disclosure may be used in other processes and/or in other devices, such as FinFETs, nanosheet channel FETs, Horizontal Gate All Around (HGAA) FETs, Vertical Gate All Around (VGAA) FETs, and other suitable devices.

In some alternative embodiments, instead of using SOI structure 102, the semiconductor device structure 100 may use silicon-on-sapphire (SOS) substrate. In such cases, the SOS substrate may be formed by heteroepitaxial growth of silicon on crystalline or monocrystalline sapphire. The SOS substrate may be fabricated using chemical vapor deposition (CVD) or any suitable deposition technique.

Figure 2A:
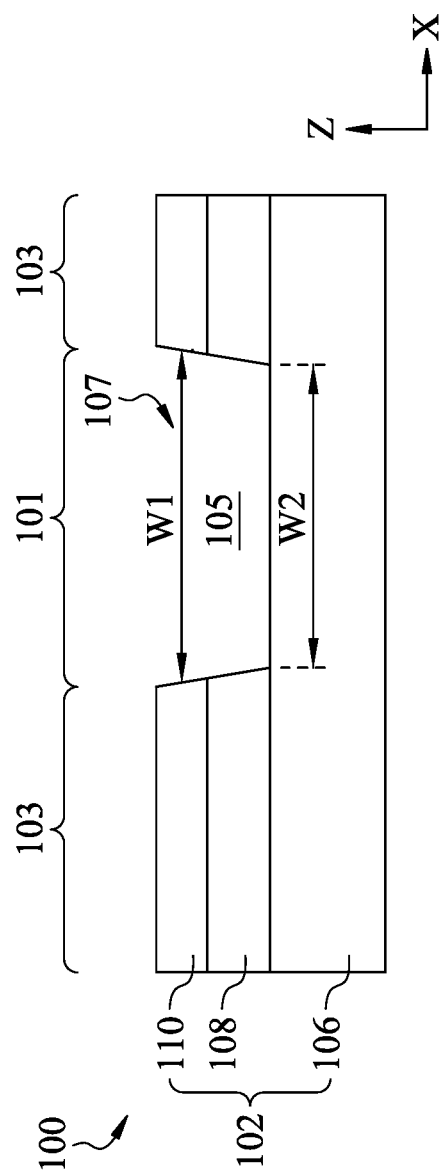
Figure 2B:
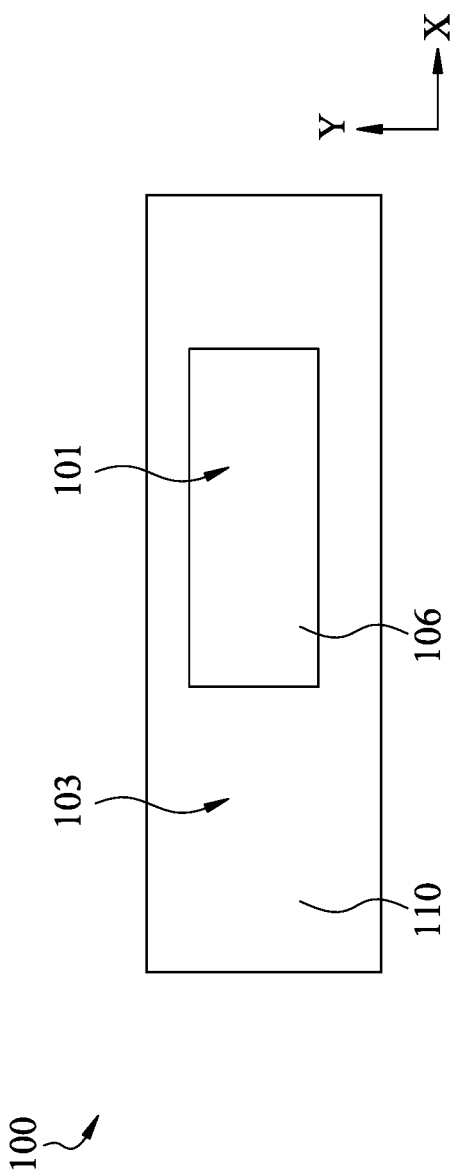

At operation 1004, the pattern (e.g., opening 105) of the mask layer 104 is transferred to the semiconductor layer 110 and the insulator layer 108, as shown in FIGS. 2A and 2B. In some embodiments, the pattern is transferred to a portion of the semiconductor substrate 106. FIGS. 2A and 2B show an exemplary embodiment where the opening 105 is transferred to the semiconductor layer 110, the insulator layer 108, and the semiconductor substrate 106. The transferring of the opening 105 forms a trench 107 extending through the semiconductor layer 110 and the insulator layer 108, and exposing a portion of the semiconductor substrate 106. The transferring of the pattern may be performed by removing portions of the semiconductor layer 110, the insulator layer 108, and the semiconductor substrate 106 using one or more suitable etch processes, such as a dry etch, a wet etch, or a combination thereof. In some embodiments where the semiconductor substrate 106 and the semiconductor layer 110 include silicon, the semiconductor substrate 106 and the semiconductor layer 110 may be etched by a reactive ion etch (RIE) process with etch process gases including a form of fluorine, such as $CHF_3$, $CF_4$, $CH_2F_2$, $C_2H_4F_2$, $SF_3$, $SF_6$, the like, or a combination thereof. Additional process gasses may be used, such as Ar, $N_2$, $O_2$, and the like, or a combination thereof. In some embodiments where the insulator layer 108 includes oxides, the insulator layer 108 may be etched by a dry etch process using an etchant including $CF_4$, $CHF_3$, or other fluorine-containing gas. The dry etch process may be anisotropic, such as a RIE process.

In some embodiments, the trench 107 is formed such that its diameter decreases in a direction away from the semiconductor layer 110. For example, the trench 107 may have an upper diameter having a width W1 and a bottom diameter having a width W2 that is less than the width W1. In some embodiments, the exposed surface of the semiconductor substrate 106 may have a substantially flat surface as shown in FIG. 2A. In some embodiments, the exposed surface of the semiconductor substrate 106 may have a concave surface. In some embodiments, the exposed surface of the semiconductor substrate 106 may have a convex upward surface. The trench 107 may have sharp corners at the bottom as shown in FIG. 2A. Alternatively, the removal process may be adjusted so that the trench 107 is formed with smooth, rounded bottom corners at the sidewall portion of the trench 107. In such cases, after the removal of the semiconductor layer 110 and the insulator layer 108, an etch process using a fluoro-hydrocarbon based etching chemistry may be used to remove a portion of the semiconductor substrate 106. During the etch process, the removal of the semiconductor substrate 106 may form polymer deposits at the sidewall portion of the trench 107. The higher etch rate at the center portion of the trench 107 than the bottom corners prevent sharpening of the trench bottom corners while contributing to rounding of the polymer deposits at the bottom corners of the trench 107. Suitable fluoro-hydrocarbon based etching chemistry may include, but is not limited to, $CHF_3$, $CH_2F_2$, $C_2H_4F_2$, or the like, or a combination thereof.

After formation of the trench 107, the patterned mask layer 104 is removed using any suitable process, such as a dry etch, a wet etch, or a combination thereof. A cleaning process may be performed to remove residues from exposed surfaces of the semiconductor substrate 106, the insulator layer 108, and the semiconductor layer 110. The cleaning process may be any suitable wet cleaning process including, for example, hydrofluoric acid (HF), standard clean 1 (SC1), and ozonated deionized water ($DIO_3$). In one embodiment, the cleaning process is performed by exposing the semiconductor device structure 100 to HF (1:500 dilution), followed by the $DIO_3$ rinsing and SC1 cleaning which may be a mixture of deionized (DI) water, ammonia hydroxide ($NH_4OH$), and hydrogen peroxide ($H_2O_2$). Other cleaning process, such as an APM process, which includes at least water ($H_2O$), $NH_4OH$, and $H_2O_2$, a HPM process, which includes at least $H_2O$, $H_2O_2$, and hydrogen chloride (HCl), a SPM process (also known as piranha clean), which includes at least $H_2O_2$ and sulfuric acid ($H_2SO_4$), or any combination thereof, may also be used.

At operation 1006, a spacer layer 112 is formed on the exposed surfaces of the semiconductor device structure 100. Specifically, the spacer layer 112 is conformally deposited in the trench 107 and on the exposed surfaces of the semiconductor substrate 106, the insulator layer 108, and the semiconductor layer 110, as shown in FIGS. 3A and 3B. In FIG. 3B, the semiconductor substrate 106 is shown in dotted lines since it is under the spacer layer 112. The spacer layer 112 may be made of one or more layers of dielectric material. The spacer layer 112 may serve as a first shallow trench isolation (STI) for the semiconductor device structure 100. Suitable dielectric materials may include, but are not limited to, silicon oxide ($SiO_2$), silicon nitride ($Si_3N_4$), silicon carbide (SiC), silicon oxynitride (SiON), silicon carbonnitride (SiCN), silicon oxycarbide (SiOC), silicon oxycarbonitride (SiOCN), or the like. In some embodiments, the spacer layer 112 is a multi-layer structure include two or more layers of the dielectric material discussed herein. In one embodiment, the spacer layer 112 includes a first layer 112a in contact with the semiconductor substrate 106, the insulator layer 108, and the semiconductor layer 110, a second layer 112b formed on the first layer 112a, a third layer 112c formed on the second layer 112b, and a fourth layer 112d formed on the third layer 112c. The spacer layer 112 may be formed by sequentially depositing blanket layers of the first, second, third, and fourth layers 112a, 112b, 112c, 112d using any suitable process such as atomic layer deposition (ALD), or other conformal deposition process. The first, second, third, and fourth layers 112a, 112b, 112c, 112d may include the same or different material from each other. In some embodiments, the first, second, third, and fourth layers 112a, 112b, 112c, 112d have substantially the same thickness. In some embodiments, the second, third, and fourth layers 112b, 112c, 112d have the same thickness, and the fourth layer 112d has a thickness greater than the first layer 112a. In some embodiments, the second, third, and fourth layers 112b, 112c, 112d have the same thickness, and the fourth layer 112d has a thickness less than the first layer 112a. While four spacer layers are shown in FIG. 3A, more or less layers are contemplated depending on the application. For example, the spacer layer 112 is a single layer, a bi-layer structure, or a tri-layer structure formed of any of the dielectric materials discussed herein.

In some embodiments, which can be combined with any one or more embodiments of the present disclosure, the first and second layers 112a, 112b may be formed of a dielectric material containing oxygen, the first layer 112a has a first atomic percentage of oxygen, and the second layer 112b has a second atomic percentage of oxygen greater than the first atomic percentage of oxygen. The third and fourth layers 112c, 112d may be formed of a dielectric material containing silicon, the third layer 112c has a first atomic percentage of silicon, and the fourth layer 112d has a second atomic percentage of silicon greater than the first atomic percentage of silicon. The first layer 112a having a greater atomic percent of oxygen may be advantageous as it may serve to block current leakage flowing from source region through a bulk semiconductor layer 114 (FIG. 9) and/or semiconductor layer 110 to neighboring drain region (or vice versa) when the gate is in an "off" state. The fourth layer 112d having a greater atomic percent of silicon may be advantageous as it is to be in contact with the subsequent bulk semiconductor layer 114 (e.g., silicon) and thus can be used to support epitaxial silicon growth on the spacer layer 112 (e.g., fourth layer 112d).

In some embodiments the first layer 112a may include an oxynitride, the second layer 112b may include a nitride, the third layer 112c may include a carbide, and the fourth layer 112d may include an oxide. In some embodiments, which can be combined with any one or more embodiments of the present disclosure, the first layer 112a may include an oxide, the second layer 112b may include a nitride, the third layer 112c may include a carbide, and the fourth layer 112d may include an oxynitride. In some exemplary embodiments, the first layer 112a may include SiON, the second layer 112b may include $Si_3N_4$, the third layer 112c may include SiC, and the fourth layer 112d may include $SiO_2$. In some exemplary embodiments, the first layer 112a may include $SiO_2$, the second layer 112b may include $Si_3N_4$, the third layer 112c may include SiC, and the fourth layer 112d may include SiON. In some exemplary embodiments, the first layer 112a may include $SiO_2$, the second layer 112b may include $Si_3N_4$, the third layer 112c may include SiCN, and the fourth layer 112d may include SiOCN. The first, second, third, and fourth layers 112a, 112b, 112c, 112d discussed herein may be formed in any order, depending on the application.

Figure 4A:
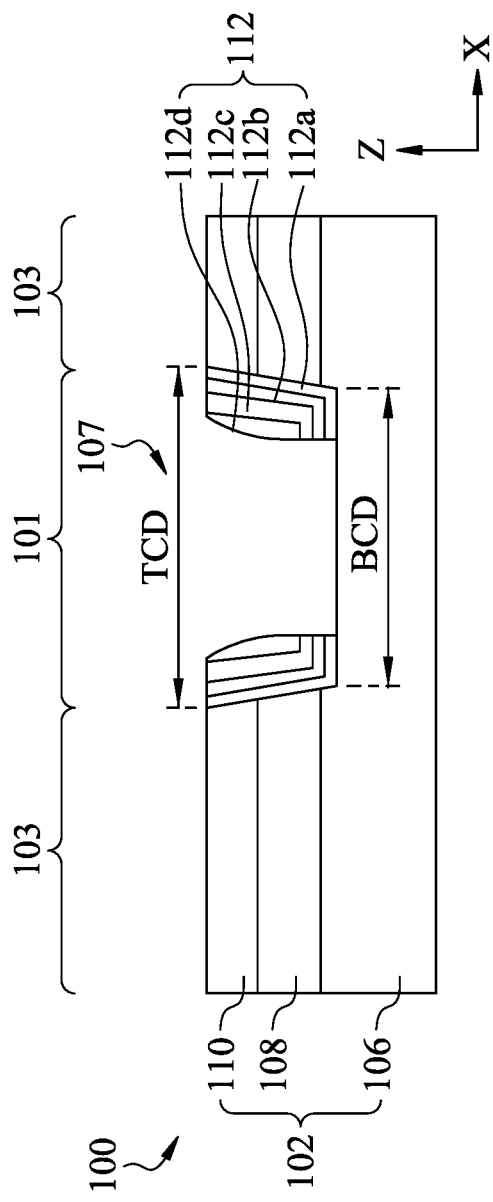
Figure 4B:
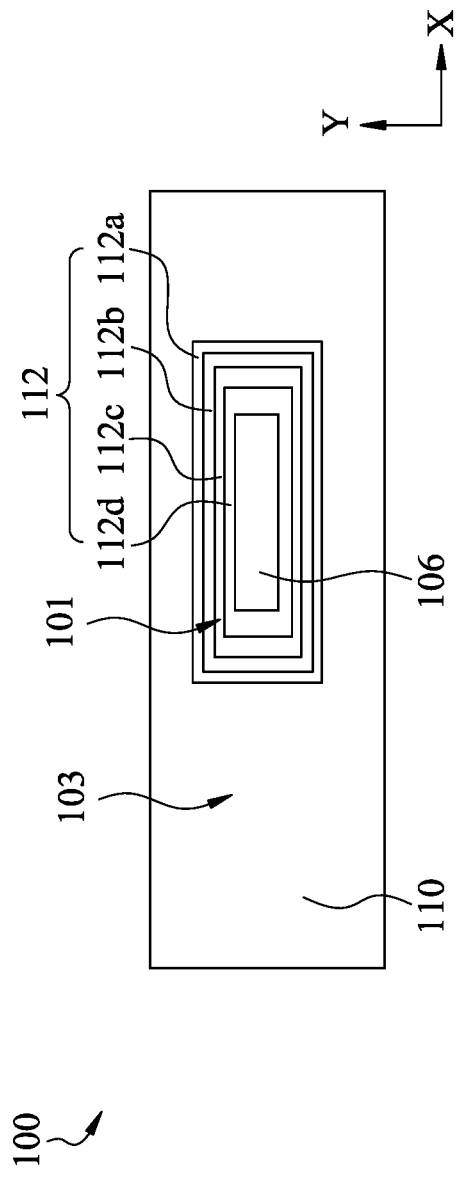

At operation 1008, portions of the spacer layer 112 are removed, as shown in FIGS. 4A and 4B. The removal of the portions of the spacer layer 112 may be performed by a dry etch, a wet etch, or a combination thereof. In some embodiments, the portions of the spacer layer 112 is removed by an anisotropic etch process, such as RIE. In some embodiments, the portions of the spacer layer 112 is removed by a wet etch using a solution of phosphoric acid ($H_3PO_4$) or $H_3PO_4$ and DHF (having a ratio of water to HF in a range from about 50:1 to about 500:1). In some embodiments, the portions of the spacer layer 112 is removed using a wet etch discussed herein, followed by a dry etch using a fluorine-based chemistry, such as $CF_4$, $CHF_3$, $CH_2CH_3F$, or a combination thereof. In any case, the removal process is performed such that the etch rate over the horizontal surfaces is significantly greater than that of the vertical surfaces or sidewalls of the trench 107. As a result of the removal process, most or all of the spacer layer 112 is removed from horizontal surfaces of the semiconductor device structure 100, such as the tops of the semiconductor layer 110 and the semiconductor substrate 106, while the spacer layer 112 on vertical surfaces of the semiconductor device structure 100, such as the exposed surfaces of the semiconductor layer 110, the insulator layer 108, and the semiconductor substrate 106 on the sidewall of the trench 107, remain substantially intact or slightly etched. The removal of the portions of the spacer layer 112 reveals the semiconductor layer 110 and a portion of the semiconductor substrate 106. The trench 107 is also revealed upon removal of the portions of the spacer 112. In some embodiments, the spacer layer 112 is formed with a top critical dimension (TCD) and a bottom critical dimension (BCD), and the TCD can be greater, smaller, or equal to the BCD. While the top surfaces of the semiconductor layer 110 and the spacer layer 112 (e.g., first, second, third, and fourth layers 112a, 112b, 112c, 112d) are shown as substantially co-planar, in some embodiments the top surface of the spacer layer 112 may be at an elevation higher than that of the top surface of the semiconductor layer 110.

Figure 5A:
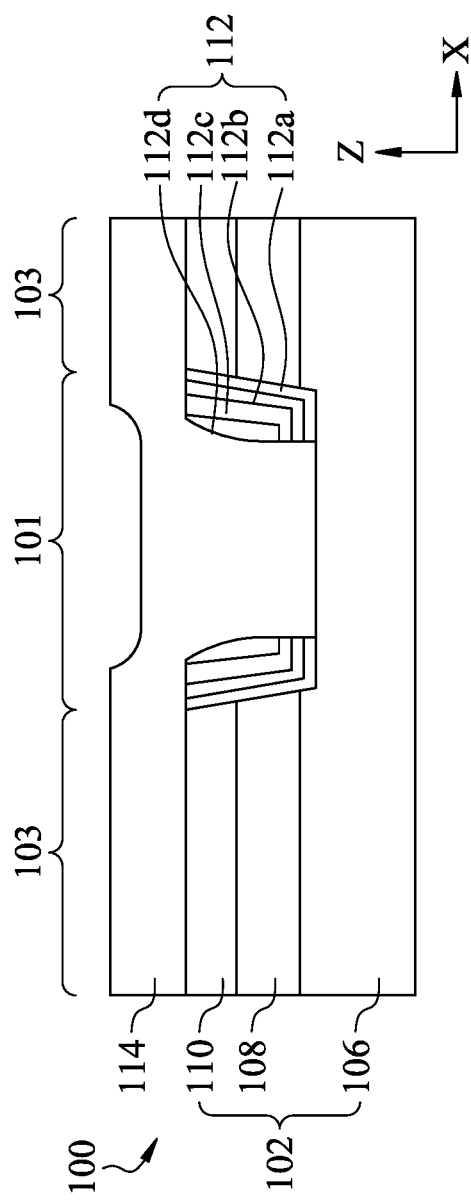
Figure 5B:
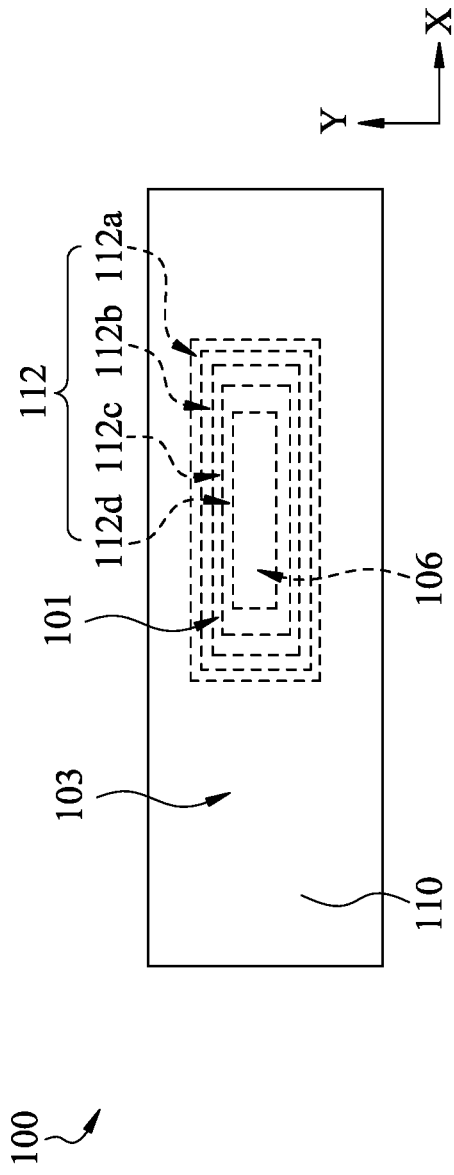

At operation 1010, a bulk semiconductor layer 114 is formed on the exposed surfaces of the semiconductor device structure 100, as shown in FIGS. 5A and 5B. In FIG. 5B, the first, second, third, and fourth layers 112a-112d are shown in dotted lines since they are under the bulk semiconductor layer 114. The bulk semiconductor layer 114 may be formed on the exposed surfaces of the semiconductor layer 110, the spacer layer 112, and the semiconductor substrate 106. The bulk semiconductor layer 114 fills the trench 107 and above the top surface of the semiconductor layer 110 to a predetermined thickness. The top surface of the bulk semiconductor layer 114 at the bulk silicon region 101 may have a height that is slightly lower than a height of the top surface of the bulk semiconductor layer 114 at the SOI region 103 due to the trench 107. The bulk semiconductor layer 114 may be formed by an epitaxial growth process using CVD, ALD, or molecular beam epitaxy (MBE).

The bulk semiconductor layer 114 may include or be formed of the same material as the semiconductor substrate 106 and/or the semiconductor layer 110. In some embodiments, the bulk semiconductor layer 114 may include or be formed of a material different than the semiconductor substrate 106 and/or the semiconductor layer 110. In some embodiments, the bulk semiconductor layer 114 may have n-type or p-type dopants, and the doping concentration of the bulk semiconductor layer 114 may be different from that of the semiconductor layer 110. In one embodiment, the bulk semiconductor layer 114 is formed of silicon. In one embodiment, the bulk semiconductor layer 114 is formed of silicon germanium. In one embodiment, the bulk semiconductor layer 114 is formed of germanium. The bulk semiconductor layer 114 may have a resistivity in a range of about 100 ohm/square to about 1000 ohm/square. The bulk semiconductor layer 114 may have a dopant concentration $2 \times 10^{13}$ atoms/cm$^3$ to about $5 \times 10^{22}$ atoms/cm$^3$. In some embodiments, the resistivity of the bulk semiconductor layer 114 is different from that of the semiconductor layer 110. In some embodiments, the dopant concentration of the bulk semiconductor layer 114 is different from that of the semiconductor layer 110.

The crystalline semiconductor material of the semiconductor substrate 106 and the semiconductor layer 110 supports the epitaxial growth of the bulk semiconductor layer 114 thereon. The epitaxial growth of the bulk semiconductor layer 114 on the spacer layer 112 is achieved due to the greater silicon content in a portion of the spacer layer 112 (e.g., fourth layer 112d). Even if the bulk semiconductor layer 114 may have poor epitaxial growth on the other portions of the spacer layer 112 (e.g., on exposed horizontal surfaces of the first, second, and third layers 112a, 112b, 112c), it is less of a concern since the bulk semiconductor layer 114 on the exposed horizontal surfaces of the first, second, and third layers 112a, 112b, 112c is to be moved in the subsequent planarization process.

In some embodiments, prior to the formation of the bulk semiconductor layer 114, an intermediate seed layer (not shown) may be deposited on the exposed surfaces of the semiconductor device structure 100 to allow growth of the bulk semiconductor layer 114 over the spacer layer 112. The material of the intermediate seed layer is selected such that the subsequent bulk semiconductor layer 114 may directly deposit on the intermediate seed layer, thereby enabling the deposition of the bulk semiconductor layer 114 over the dielectric surfaces of the semiconductor device structure 100, such as exposed silicon oxide surface of the spacer layer 112. In some embodiments where the fourth layer 112d is formed of silicon oxide, the intermediate seed layer may include or be formed of a silicon-containing material, such as silicon or silicon germanium. In cases where the silicon germanium seed layer is desired, the intermediate seed layer may be formed by heating the semiconductor device structure 100 to a temperature of about 200 degrees Celsius to about 600 degrees Celsius, and exposing the exposed surfaces of the semiconductor device structure 100 to a precursor including at least a silicon source and a germanium source. Suitable silicon source may include, but is not limited to, silane ($SiH_4$), disilane ($Si_2H_6$), trisilane ($Si_3H_8$), tetrasilane ($Si_4H_{10}$), or the like. Suitable germanium source may include, but is not limited to, germane ($GeH_4$), digermane ($Ge_2H_6$), trigermane ($Ge_3H_8$), or germylsilane ($GeH_6Si$) or the like. The formation of the bulk semiconductor layer 114 may be performed in a CVD based reaction chamber. The silicon germanium seed layer allows the bulk semiconductor layer 114, such as silicon, silicon germanium, or germanium, to be directly formed thereon, and thus enabling direct deposition of the bulk semiconductor layer 114 on the spacer layer 112, as well as other semiconductive surfaces of the semiconductor device structure 100, such as on the semiconductor layer 110 and the semiconductor substrate 106.

In some embodiments, prior to forming the bulk semiconductor layer 114, the exposed surfaces of the semiconductor device structure 100 may be subjected to a surface treatment. The surface treatment may form a material layer (not shown) to assist growth of the bulk semiconductor layer 114 on the spacer layer 112. In cases where the bulk semiconductor layer 114 includes silicon, the material layer can be amorphous silicon. An exemplary surface treatment may include spraying or coating the exposed surfaces of the semiconductor layer 110, the spacer layer 112, and the semiconductor substrate 106 with nanoparticles, which may be amorphous silicon, crystalline silicon, polysilicon, or a combination thereof. The nanoparticles are then subjected to a thermal treatment (e.g., laser anneals, flash anneals, or the like) to form a thin layer of material layer on the exposed surfaces of the semiconductor layer 110, the spacer layer 112, and the semiconductor substrate 106, thereby forming an amorphous silicon layer. Other material layer, such as polycrystalline silicon, germanium, silicon germanium alloy, etc., may be used depending on the bulk semiconductor layer to be formed. After the surface treatment, the bulk semiconductor layer 114 is formed on the material layer. Therefore, the material layer is disposed between and in contact with the bulk semiconductor layer 114 and the underlying layers, such as the semiconductor layer 110, the spacer layer 112, and the semiconductor substrate 106.

Figure 6A:
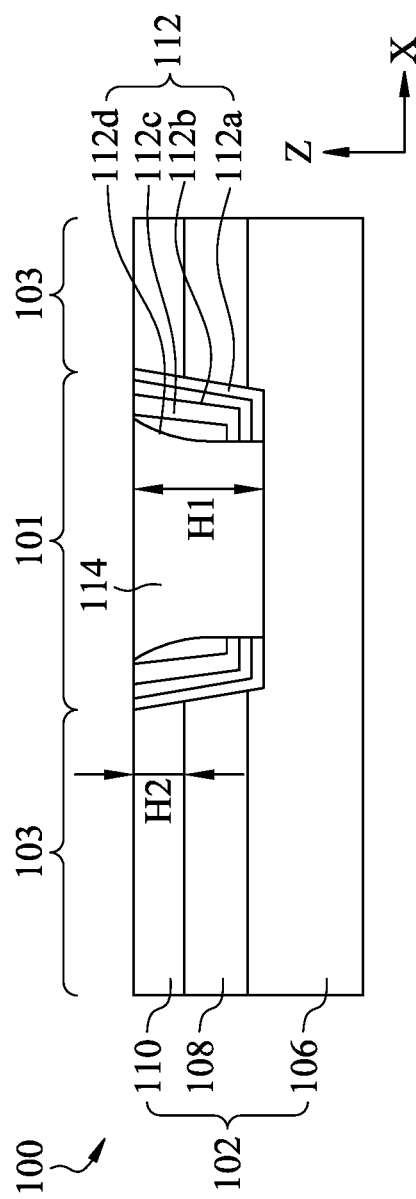
Figure 6B:
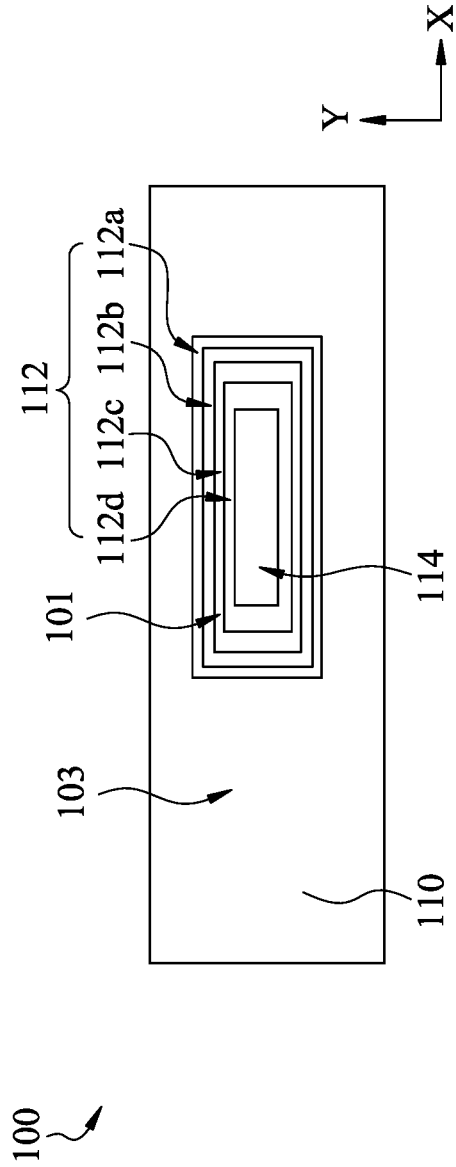

At operation 1012, after the bulk semiconductor layer 114 is formed, a planarization operation, such as a chemical mechanical polishing (CMP) process is performed on the semiconductor device structure 100 until the top surfaces of the spacer layer 112 and/or the semiconductor layer 110 is exposed, as shown in FIGS. 6A and 6B. In some embodiments, the planarization operation may be a combination of the CMP process and a timed etch process (e.g., RIE). In such cases, the CMP process may be performed to remove a portion of the bulk semiconductor layer 114, followed by the timed etch process that selectively etches the bulk semiconductor layer 114 and stops on the spacer layer 112. As a result of the planarization process, the top surfaces of the semiconductor layer 110, the spacer layer 112 (e.g., first, second, third, and fourth layers 112a, 112b, 112c, 112d), and the bulk semiconductor layer 114 are substantially co-planar. In some embodiments, the timed etch process may be performed so that it over-etches a portion of the spacer layer 112, resulting in the top surface of the spacer layer 112 at an elevation lower than a top surface of the bulk semiconductor layer 114.

The resulting bulk semiconductor layer 114 has a height H1 and the semiconductor layer 110 has a height H2 less than the height H1. As the threshold voltage of the MOSFET devices changes with the thickness of active silicon layer (e.g., semiconductor layer 110 and bulk semiconductor layer 114), the height ratio of H1 to H2 at different bulk silicon region 101 and the SOI region 103 can be adjusted to control the threshold voltage for various applications. In some embodiments, the height ratio of H1 to H2 may be greater than 1 to 1 and less than 5 to 1, for example in a range of about 2:1 to about 4:1, such as about 3:1. In some examples, the height H1 may be in a range of about 30 nm to about 600 nm, and the height H2 may be in a range of about 10 nm to about 200 nm. In some embodiments, the bulk semiconductor layer 114 may be etched back so that the top surface of the bulk semiconductor layer 114 is lower than the top surface of the spacer layer 112. In some embodiments where the bulk semiconductor layer 114 and the semiconductor layer 110 are formed of the same material (e.g., silicon or silicon germanium), the etch back process may result in the top surfaces of the bulk semiconductor layer 114 and the semiconductor layer 110 at an elevation lower than the top surface of the spacer layer 112. In some alternative embodiments where the bulk semiconductor layer 114 and the semiconductor layer 110 are formed of a different material, an etch back process may be performed such that the etchant removes the bulk semiconductor layer 114 with respect to the semiconductor layer 110 and the spacer layer 112, resulting in the top surface the bulk semiconductor layer 114 at an elevation lower than the top surfaces of the semiconductor layer 110 and the spacer layer 112.

Figure 7A:
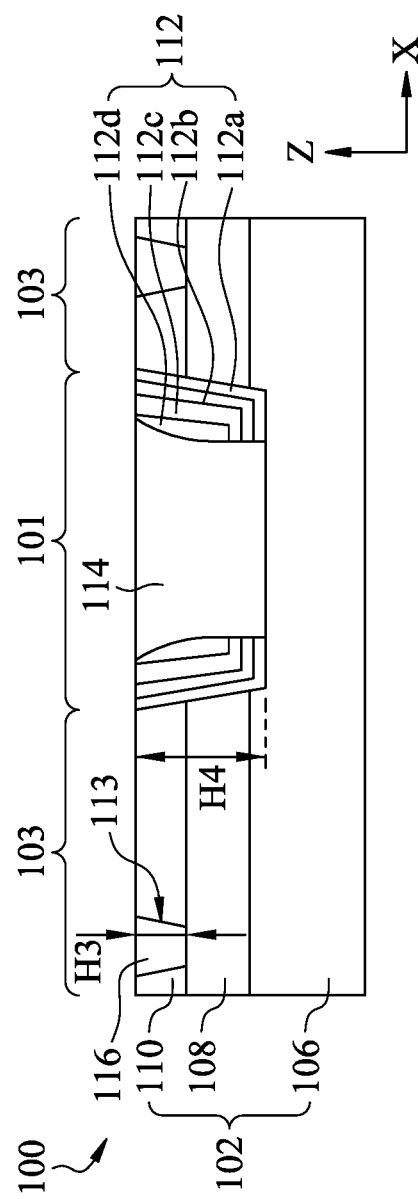
Figure 7B:
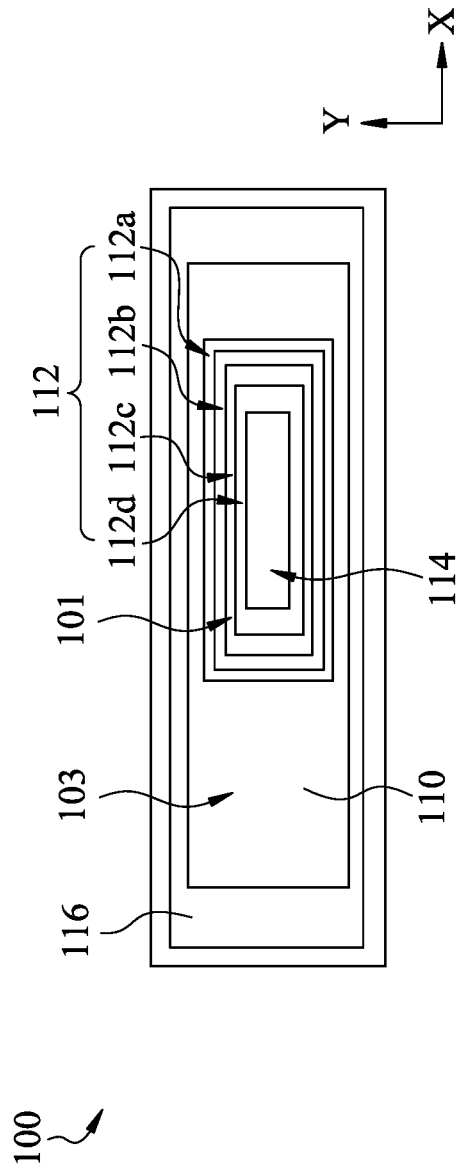

At operation 1014, a portion of the semiconductor layer 110 is removed and a second STI 116 is formed in the semiconductor layer 110 at the SOI region 103, as shown in FIGS. 7A and 7B. The second STI 116 is formed to surround the bulk silicon region 101. In some embodiments, the second STI 116 is formed to surround the bulk silicon region 101 and a portion of the SOI region 103. The second STI may include or be made of a dielectric material, such as $SiO_2$, $Si_3N_4$, SiC, SiON, SiCN, SiOC, SiOCN, or the like. The second STI 116 may include the same or different material than that of the first STI (i.e., spacer layer 112). The second STI 116 may be formed by using a STI mask (not shown). The STI mask may be made by first forming a hardmask layer on the semiconductor device structure 100. The hardmask layer is formed on the top surfaces of the semiconductor layer 110, the spacer layer (e.g., first, second, third, and fourth layers 112a, 112b, 112c, 112d), and the bulk semiconductor layer 114. The hardmask layer may include or be formed of an oxide, such as tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG). Thereafter, the hardmask layer is patterned to form the STI mask. The STI mask exposes a portion of the semiconductor layer 110 at a predetermined area of the SOI region 103, such as a peripheral area of the SOI region 103. Portion of the semiconductor layer 110 is then removed by a removal process using the STI mask as an etch mask. The removal of the portion of the semiconductor layer 110 forms a trench 113 extending through the semiconductor layer 110 to expose a portion of the insulator layer 108. The removal process may be a dry etch (e.g., RIE) or any suitable technique. In any case, the removal process is selective to the insulator layer 108, which may serve as an etch stop layer. After a portion of the insulator layer 108 is exposed, the STI mask is removed and the STI material is formed in the trench 113 to form the second STI 116. A planarization process, such as a CMP, is then performed on the semiconductor device structure 100 so that a top surface of the second STI 116 is substantially co-planar with the top surfaces of the semiconductor layer 110, the spacer layer 112, and the bulk semiconductor layer 114.

As can be seen in FIG. 7A, the spacer layer 112 is disposed between and in contact with the bulk semiconductor layer 114 and the semiconductor layer 110, the insulator layer 108, as well as the semiconductor substrate 106. Particularly, the first, second, third, and fourth layers 112a, 112b, 112c, 112d on a first side of the spacer layer 112 is in contact with the bulk semiconductor layer 114, while the first layer 112a on a second side of the spacer layer 112 opposing the first side is in contact with the semiconductor layer 110, the insulator layer 108, and the semiconductor substrate 106.

In some embodiments, the second STI 116 may be formed with an upper width and a bottom width that is less than the upper width. In some embodiments, the second STI 116 has sharp bottom corners at the sidewall portion of the trench 113. Alternatively, the second STI 116 may have smooth, rounded bottom corners at the sidewall portion of the trench 113. The resulting second STI 116 has a height H3 measuring from a top of the second STI 116 to a bottom of the second STI 116, and the spacer layer 112 (i.e., first STI) has a height H4 measuring from a top of the spacer layer 112 to a bottom of the spacer layer 112, wherein the height H4 is greater than the height H3. In some embodiments, the height ratio of H4 to H3 may be greater than 1 to 1 and less than 5 to 1, for example in a range of about 1.5:1 to about 3:1. If the height ratio of H4 to H3 is greater than 5 to 1, the second STI 116 may not be sufficient to isolate the transistor device to be formed at the SOI region 103. On the other hand, if the height ratio of H4 to H3 is less than 1 to 1, the manufacturing cost is increased without significant advantage.

Figure 7C:
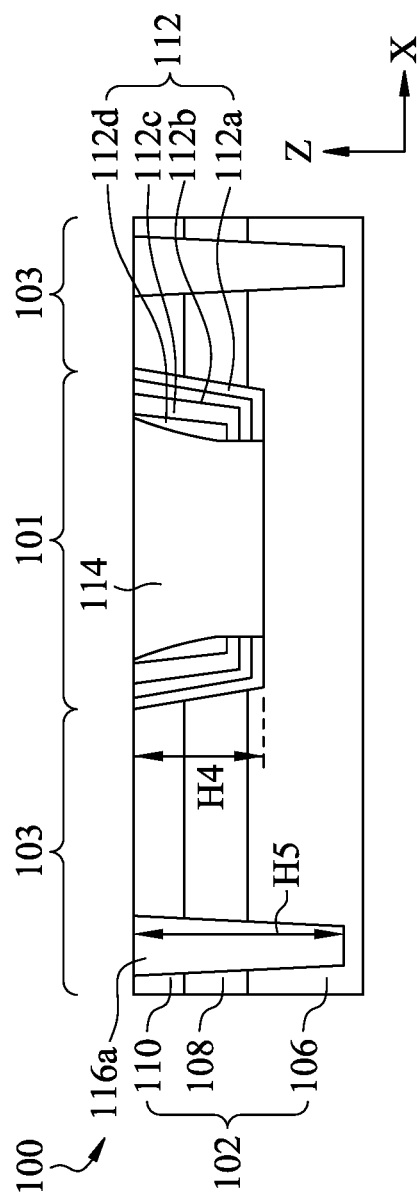
FIGS. 7C-7E are cross-sectional views of the semiconductor device structure showing a second STI with different heights, in accordance with some embodiments.
Figure 7D:
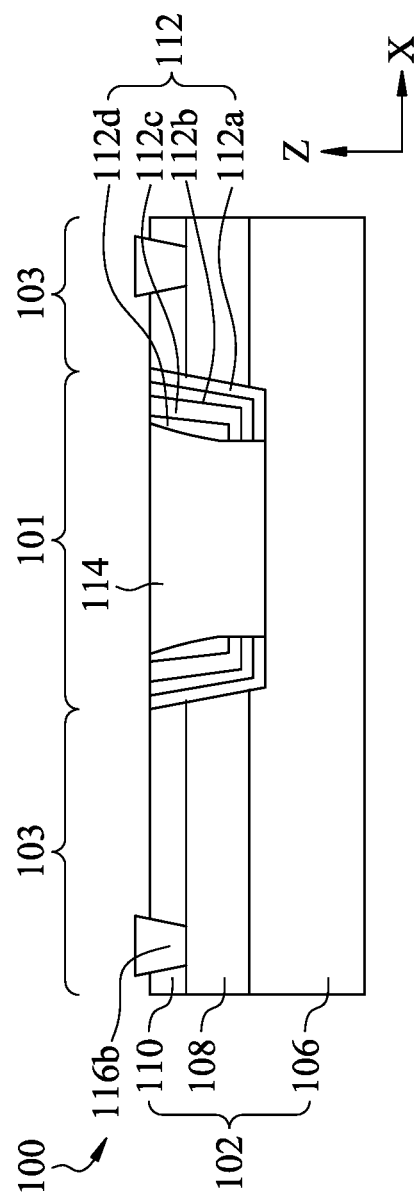
Figure 7E:
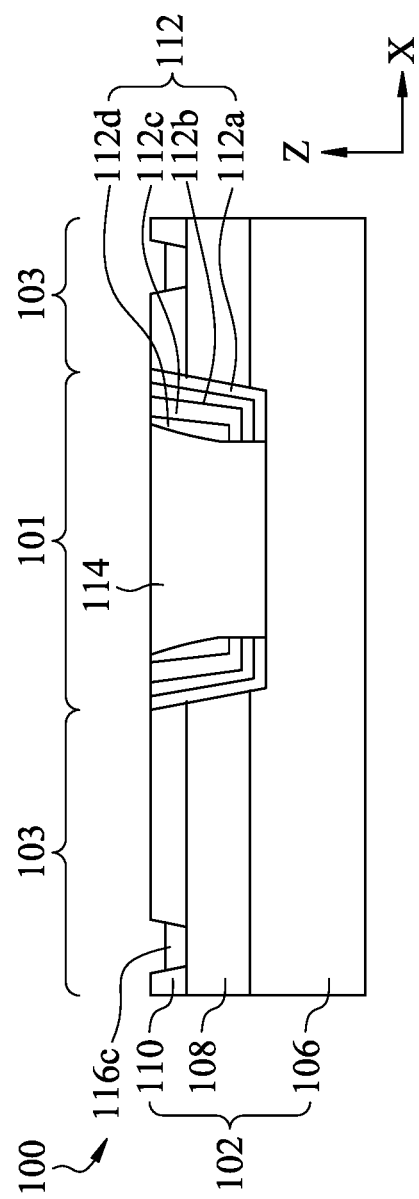

FIGS. 7C-7E are cross-sectional views of the semiconductor device structure 100 showing a second STI with different heights, in accordance with some embodiments. In FIG. 7C, in some embodiments a second STI 116a is further extended through the insulator layer 108 and into the semiconductor substrate 106. The second STI 116a may extend a thickness into the semiconductor substrate 106. The second STI 116a has a height H5 measuring from a top of the second STI 116a to a bottom of the second STI 116a, wherein the height ratio of H5 to H4 (H5:H4) may be in a range of about 1:1 to about 5:1, for example about 2:1 to about 4:1. Having the second STI 116a extended into the semiconductor substrate 106 may be advantageous as it and the spacer layer 112 (i.e., first STI) provides greater dielectric isolation around the transistor device to be formed at the SOI region 103. As a result, the power consumption is reduced and the overall performance of the semiconductor device structure 100 is improved.

In some embodiments, the second STI is formed so that a top surface of the second STI is at an elevation higher than a top surface of the semiconductor layer 110. In some embodiments, the second STI is formed so that the top surface of the second STI is at an elevation lower than a top surface of the semiconductor layer 110. Such a height difference may be achieved through the CMP process to adjust center-to-edge removal rate, or through a selective etch back process. FIG. 7D illustrates an embodiment where a second STI 116b extends a thickness above the top surface of the semiconductor layer 110. In this embodiment, the second STI 116b has a top surface at an elevation higher than the top surfaces of the semiconductor layer 110, the spacer layer 112, and the bulk semiconductor layer 114. FIG. 7E illustrates an embodiment where a second STI 116c has a top surface of the second STI 116c at an elevation lower than the top surfaces of the semiconductor layer 110, the spacer layer 112, and the bulk semiconductor layer 114.

At operation 1016, one or more gate structures 118 are formed over the semiconductor device structure 100, as shown in FIGS. 8A and 8B. In one embodiment, at least one gate structure 118 is formed at the SOI region 103 between the second STI 116 and the spacer layer 112, and at least one gate structure 118 is formed at the bulk silicon region 101. Specifically, the gate structure 118 is formed over the semiconductor layer 110 and the bulk semiconductor layer 114. The one or more gate structures 118 may extend along the Y direction. In some embodiments, the gate structure 118 at the SOI region 103 extends along the Y direction so that a portion of the gate structure 118 is in contact with the second STI 116. Likewise, the gate structure 118 at the bulk silicon region 101 extends along the Y direction so that a portion of the gate structure 118 is in contact with the spacer layer 112 (e.g., first, second, third and fourth layers 112a, 112b, 112c, 112d) and the second STI 116.

Each gate structure 118 generally includes a gate dielectric layer 120 and a gate electrode layer 122. The gate dielectric layer 120 may include or be formed of a dielectric material such as an oxygen-containing material or a nitrogen-containing material, a high-k dielectric material having a k value greater than that of silicon dioxide, or multilayers thereof, and can be deposited by CVD, PECVD, or ALD. The gate electrode layer 122 may include one or more layers of electrically conductive material, such as polysilicon, aluminum, copper, titanium, tantalum, tungsten, cobalt, molybdenum, tantalum nitride, nickel silicide, cobalt silicide, TiN, WN, AlTi, AlTiO, AltiC, AlTiN, TaCN, TaC, TaSiN, metal alloys, other suitable materials, and/or combinations thereof. For n-type MOSFET devices, the gate electrode layer 122 may be AlTiO, AlTiC, or a combination thereof. For p-type MOSFET devices, the gate electrode layer 122 may be AlTiO, AlTiC, AlTiN, or a combination thereof. The gate electrode layers 168 may be formed by PVD, CVD, ALD, electro-plating, or other suitable method. The gate dielectric layer 120 and the gate electrode layer 122 may be formed by sequentially depositing blanket layers of the gate dielectric layer 120 and the gate electrode layer 122, followed by pattern and etch processes. The pattern process may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. The etch process may include dry etch (e.g., RIE), wet etch, other etch methods, and/or combinations thereof.

At operation 1018, a source/drain (S/D) implantation process is performed to form self-aligned S/D regions 126 in the semiconductor layer 110 and the bulk semiconductor layer 114, respectively, as shown in FIG. 9. The S/D regions 126 are formed by subjecting the SOI region 103 and the bulk silicon region 101 to the S/D implantation process. The S/D implantation process 125 may be performed using ion beam, plasma source ion immersion, or any other suitable techniques. The S/D implantation process is performed so that the ion species (dopants) are implanted into the semiconductor layer 110 and the bulk semiconductor layer 114 not covered by the gate structures 118. The S/D implantation process may be a vertical implantation process (i.e., ion streams are substantially perpendicular to the surface of the layer to be implanted) and/or a tilted (angled) implantation process. The tilted implantation process allows the ion streams to be directed at an angle with respect to the top surfaces of the semiconductor layer 110 and the bulk semiconductor layer 114. Depending on the transistor devices to be formed in the SOI region 103 and the bulk silicon region 101, the implantation process may include p-type dopants, such as boron (B) or other suitable p-type dopants, or n-type dopants, such as phosphorus (P), arsenic (As), or other suitable n-type dopants. One of a pair of S/D regions 126 located on one side of the gate structure 118 can be a source (S) region, and the other of the pair of the S/D regions 126 located on the other side of the gate structure 118 can be a drain (D) region. The source region and the drain region are connected by a channel region (e.g., the semiconductor layer 110 or bulk semiconductor layer 114). It should be noted that a S/D region can be referred to as a source and/or a drain as the structures thereof are substantially the same.

After formation of the S/D regions 126, a gate spacer 124 is formed on opposing sidewalls of the gate structure 118. The gate spacer 124 may include or be made of $SiO_2$, $Si_3N_4$, SiC, SiON, SiCN, SiOC, SiOCN, and/or any combinations thereof, and can be formed by ALD or any suitable processes. The gate spacers 124 may be formed by conformally depositing one or more layers for the gate spacers 124 and anisotropically etching the one or more layers using, for example, RIE. In some embodiments, the gate spacer 124 may be formed on opposing sidewalls of the gate structure 118 prior to forming the S/D regions 126.

In some embodiments, the semiconductor device structure 100 may further include lightly doped source/drain (LDD) regions 123 to minimize the hot carrier effect. The LDD regions 123 are disposed below the gate spacers 124 and between the channel region (e.g., the semiconductor layer 110 and the bulk semiconductor layer 114) and the S/D regions 126. The LDD regions 123 may be formed as part of the S/D implantation process 125 or before the formation of the gate spacers 124. The LDD regions 123 may be formed by implanting n-type or p-type dopants into the semiconductor layer 110 and the bulk semiconductor layer 114, using the gate structures 118 as a mask so that the LDD regions 123 are substantially aligned with the edges of the gate structures 118. The dopant concentration at the LDD regions 123 is less as compared to the S/D regions 126.

The semiconductor device structure 100 includes at least a first MOSFET device fabricated in the bulk silicon region 101 of the semiconductor device structure 100 and a second MOSFET device fabricated in the SOI region 103 of the semiconductor device structure 100, wherein the first and second MOSFET devices share the same semiconductor substrate 106. In one embodiment, the first MOSFET device is an n-type MOSFET device and the second MOSFET device is a p-type MOSFET. In another embodiment, the first MOSFET device is an p-type MOSFET device and the second MOSFET device is a n-type MOSFET. In yet another embodiment, both the first and second MOSFET devices are both n-type MOSFET devices or p-type MOSFET devices.

It is contemplated that the semiconductor device structure 100 may undergo further manufacturing processes to form various features, such as a contact etch stop layer (CESL) formed on the S/D regions 126 and gate structures 118, an interlayer dielectric (ILD) formed on the CESL, S/D contacts and gate contacts in electrical connection with the S/D regions 126 and gate electrode layer 122, respectively, and an interconnection structure formed over the semiconductor device structure 100 for connecting the S/D contacts and gate contacts to power source such as positive voltage VDD or negative voltage VSS.

Embodiments of the present disclosure provides an improved semiconductor device structure 100 comprising first metal-oxide-semiconductor field-effect transistor (MOSFET) device formed on a silicon-on-insulator (SOI) region and second MOSFET device formed on a bulk silicon region, wherein the SOI region and the bulk silicon region share the same semiconductor substrate. The first and second MOSFET devices have different active silicon layer thickness (e.g., semiconductor layer 110 and bulk semiconductor layer 114) to provide different device characteristics such as the threshold voltage for different applications. Particularly, the first and second MOSFET devices on same semiconductor substrate can vary with different characteristics to serve as partially depleted SOI devices and/or full depleted bulk silicon devices. This is advantageous comparing to conventional MOSFET device structure with nearly identical thickness of active silicon either over SOI substrate or over bulk silicon substrates, which has limits in device performance and features. In some embodiments, the first MOSFET device is separated from the second MOSFET device by a dielectric spacer layer, which and an insulator layer of the SOI provide full dielectric isolation for the first and second MOSFET devices at different regions and minimizes current leakage from source/drain junction to substrate.

An embodiment is a semiconductor device structure. The semiconductor device structure includes a first MOSFET device disposed at a first region of a semiconductor substrate, the first MOSFET device comprises a bulk semiconductor layer contacting the semiconductor substrate, and the bulk semiconductor layer has a first height, a first gate structure disposed over the bulk semiconductor layer, and first S/D regions disposed in the bulk semiconductor layer on opposite sides of the first gate structure. The device structure includes a second MOSFET device disposed at a second region of the semiconductor substrate, the second MOSFET device comprises a semiconductor layer disposed over the semiconductor substrate, and the semiconductor layer has a second height different than the first height, a second gate structure disposed over the semiconductor layer, and second S/D regions disposed in the semiconductor layer on opposite sides of the second gate structure. The structure further includes an insulator layer disposed between and in contact with the semiconductor substrate and the semiconductor layer, and a spacer layer on the semiconductor substrate, the spacer layer isolating the first MOSFET device from the second MOSFET device, and a portion of the spacer layer is disposed between and in contact with the insulator layer and the bulk semiconductor layer.

Another embodiment is a semiconductor device structure. The semiconductor device structure includes a silicon substrate comprising a bulk silicon region and a silicon-on-insulator (SOI) region, a first shallow trench isolation (STI) disposed on the silicon substrate to isolate the bulk silicon region from the SOI region, a first metal oxide semiconductor field effect transistor (MOSFET) device disposed at the bulk silicon region, the first MOSFET device comprising a bulk semiconductor layer in contact with the silicon substrate, a second STI disposed to surround the first STI, a second MOSFET device disposed at the SOI region between the first STI and the second STI, the second MOSFET device comprising a semiconductor layer in contact with the first STI and the second STI, and an insulator layer disposed between and in contact with the semiconductor layer and the silicon substrate.

A further embodiment is a method. The method includes forming a mask layer on a silicon-on-insulator (SOI) structure, wherein the mask layer is patterned to define a bulk silicon region and a SOI region, forming a trench through a portion of a semiconductor layer and an insulator layer of the SOI structure using the patterned mask layer to expose a top surface of a silicon-containing substrate, forming a first shallow trench isolation (STI) on sidewalls of the trench, forming a bulk semiconductor layer in the trench, the bulk semiconductor layer being in contact with the first STI and the exposed top surface of the silicon-containing substrate, forming a second STI in the semiconductor layer, the second STI surrounding the first STI, forming a first gate structure and a second gate structure over the bulk semiconductor layer and the semiconductor layer, respectively, forming source/drain regions in the bulk semiconductor layer and the semiconductor layer at regions not covered by the first and second gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a semiconductor device structure, comprising:

forming a mask layer on a silicon-on-insulator (SOI) structure, wherein the mask layer is patterned to define a bulk silicon region and a SOI region;

forming a trench through a portion of a semiconductor layer and an insulator layer of the SOI structure using the patterned mask layer to expose a top surface of a silicon-containing substrate;

forming a first shallow trench isolation (STI) on sidewalls of the trench;

forming a bulk semiconductor layer in the trench, the bulk semiconductor layer being in contact with the first STI and the exposed top surface of the silicon-containing substrate;

forming a second STI in the semiconductor layer, the second STI surrounding the first STI;

forming a first gate structure and a second gate structure over the bulk semiconductor layer and the semiconductor layer, respectively; and forming source/drain regions in the bulk semiconductor layer and the semiconductor layer at regions not covered by the first and second gate structure.

2. The method of claim 1, wherein forming a first STI on sidewalls of the trench further comprises:

forming a first layer on and in contact with the semiconductor layer, the insulator layer, and the silicon-containing substrate;

forming a second layer on the first layer, the second layer being in contact with the bulk semiconductor layer;

forming a third layer on the second layer, the third layer being in contact with the bulk semiconductor layer; and forming a fourth layer on the third layer.

3. The method of claim 2, wherein forming a bulk semiconductor layer in the trench further comprises:

forming a seed layer on the fourth layer; and epitaxially grow the bulk semiconductor layer from the seed layer and the exposed top surface of the silicon-containing substrate.

4. The method of claim 2, wherein the first and second layers are formed of a dielectric material containing oxygen, and the third and fourth layers are formed of a dielectric material containing silicon.

5. The method of claim 4, wherein the first layer has a first atomic percentage of oxygen, and the second layer has a second atomic percentage of oxygen greater than the first atomic percentage of oxygen, and wherein the third layer has a first atomic percentage of silicon, and the fourth layer has a second atomic percentage of silicon greater than the first atomic percentage of silicon.

6. The method of claim 4, wherein the second, third, and fourth layers have the same thickness, and the fourth layer has a thickness greater than that of the first layer.

7. The method of claim 4, wherein the second, third, and fourth layers have the same thickness, and the fourth layer has a thickness less than that of the first layer.

8. The method of claim 3, wherein the fourth layer is formed of silicon oxide, and the seed layer includes silicon or silicon germanium.

9. The method of claim 1, wherein the bulk semiconductor layer has a first height and the semiconductor layer has a second height less than the first height.

10. A method for forming a semiconductor device structure, comprising:

forming a trench through a portion of a semiconductor layer, a portion of an insulator layer, and a portion of a silicon-containing substrate at a first region;

forming a first shallow trench isolation (STI) on sidewalls of the trench by sequentially forming a first layer, a second layer, a third layer, and a fourth layer in the trench, wherein the first layer is in contact with the semiconductor layer, the insulator layer, and the silicon-containing substrate;

forming a bulk semiconductor layer in the trench and on a top surface of the silicon-containing substrate;

forming a second shallow trench isolation (STI) at a second region surrounding the first region;

forming a first gate structure and a second gate structure at the first region and the second region, respectively; and forming source/drain regions at the first and second regions not covered by the first and second gate structures.

11. The method of claim 10, wherein the second STI is formed to extend into the semiconductor layer and in contact with a top surface of the insulator layer.

12. The method of claim 10, wherein the second STI is formed to extend into the semiconductor layer, the insulator layer, and into the silicon-containing substrate.

* * * * *